United States Patent

Pelly

[11] Patent Number: 5,815,391
[45] Date of Patent: Sep. 29, 1998

[54] CURRENT SENSING CIRCUIT FOR PULSE WIDTH MODULATED MOTOR DRIVE

[75] Inventor: Brian R. Pelly, Palos Verdes Estates, Calif.

[73] Assignee: International Rectifier Corporation, El Segundo, Calif.

Related U.S. Application Data

[60] Provisional application No. 60/013,666 Mar. 19, 1996.

[21] Appl. No.: 820,574
[22] Filed: Mar. 19, 1997
[51] Int. Cl.$^6$ ............................. H02M 5/257; H02H 7/00
[52] U.S. Cl. ............................. 363/98; 363/56; 363/132
[58] Field of Search ............................. 363/98, 95, 78, 363/58, 56, 50, 132

[56] References Cited

U.S. PATENT DOCUMENTS

| | | | |
|---|---|---|---|
| 3,558,983 | 1/1971 | Steen | 363/54 |
| 4,063,301 | 12/1977 | Lye | 361/88 |
| 4,482,946 | 11/1984 | Bhagwat | 363/136 |
| 4,689,733 | 8/1987 | Guth et al. | 363/51 |
| 4,980,812 | 12/1990 | Johnson, Jr. et al. | 363/44 |
| 5,019,952 | 5/1991 | Smolenski et al. | 363/16 |
| 5,177,676 | 1/1993 | Inam et al. | 363/80 |
| 5,513,089 | 4/1996 | Sudo et al. | 363/21 |

*Primary Examiner*—Adolf Berhane
*Attorney, Agent, or Firm*—Ostrolenk, Faber, Gerb & Soffen, LLP

[57] ABSTRACT

Inverter-switch currents are sensed using a conventional a-c current transformer whose primary winding is connected to the inverter-switch and whose secondary winding is connected to a signal-developing resistor. An a-c switch is driven by the inverter-switch timing signals and disconnects the output of the transformer when the inverter-switch is in an off state. Alternatively, a Rogowski coil senses the inverter-switch currents and delivers an output voltage that is proportional to the di/dt of the inverter-switch. An integrator is coupled to the output of the Rogowski coil and delivers a signal that represents the inverter-switch current. A reset circuit, responsive to the inverter-switch control signal, resets and holds the output of the integrator to zero during the off-time of the inverter-switch.

17 Claims, 9 Drawing Sheets

| PHASE A OUTPUT CURRENT | | LEG A ON | | LEG B ON | | LEG C ON | |
|---|---|---|---|---|---|---|---|
| KNOWN | UNKNOWN | LOWER | UPPER | LOWER | UPPER | LOWER | UPPER |
|  | ✓ | ✓ |  | ✓ |  | ✓ |  |
|  | ✓ | ✓ |  |  | ✓ | ✓ |  |
| ✓ |  | ✓ |  |  | ✓ |  | ✓ |
|  | ✓ | ✓ |  | ✓ |  |  | ✓ |
| ✓ |  |  | ✓ | ✓ |  | ✓ |  |
|  | ✓ |  | ✓ |  | ✓ | ✓ |  |
|  | ✓ |  | ✓ |  | ✓ |  | ✓ |
|  | ✓ |  | ✓ | ✓ |  | ✓ |  |

FIG. 1B

| PHASE A OUTPUT CURRENT | | LEG A ON | | LEG B ON | | LEG C ON | |
|---|---|---|---|---|---|---|---|
| KNOWN | UNKNOWN | LOWER | UPPER | LOWER | UPPER | LOWER | UPPER |
| ✓ | | ✓ | | ✓ | | ✓ | |
| ✓ | | ✓ | | | ✓ | ✓ | |
| ✓ | | ✓ | | | ✓ | | ✓ |
| ✓ | | ✓ | | ✓ | | | ✓ |
| ✓ | | | ✓ | ✓ | | ✓ | |
| | ✓ | ✓ | | | ✓ | ✓ | |
| | ✓ | ✓ | | | ✓ | | ✓ |
| | ✓ | | ✓ | ✓ | | | ✓ |

FIG. 2B

CURRENT SENSING CIRCUIT FOR PULSE WIDTH MODULATED MOTOR DRIVE

This is a continuation of provisional application Ser. No. 60/013,666.

FIELD OF THE INVENTION

This invention relates to the sensing of inverter current in a pulse width modulated (PWM) motor drive for vector control of a motor and, more specifically, relates to sensing of such current without the use of Hall sensors.

BACKGROUND OF THE INVENTION

High-performance motor drives require the motor current waveforms to be sensed and fed back to the PWM controller. The most common method of obtaining the required current feedback signals is from Hall sensor transducers, connected in series with the motor windings. Hall sensor transducers are bulky and expensive, and it would be desirable to find other ways of accomplishing this function.

One alternative is to sense just the inverter input current, instead of the three output currents, and then operate on this single current waveform using the PWM timing signals for the switches in the inverter to "reconstruct" three current waveforms that represent the motor currents. Such an arrangement is shown in FIG. 1A.

Reconstruction of the motor currents from the inverter input current, however, may not have the precision needed for vector control of the motor. As shown in FIG. 1B, the current in a given motor phase can be precisely defined in only two of eight possible states of the inverter switches. The missing pieces of the reconstructed motor current waveforms can be "calculated back" but not with total precision.

Another approach, which provides the needed accuracy for vector control, is to reconstruct the motor current waveforms from signals obtained from current-viewing resistors 20–22 arranged in series with each of the lower three inverter switches. This arrangement is shown in FIG. 2A.

As shown in FIG. 2B, the current in any given motor phase of this arrangement is known for five of eight possible states of the inverter switches. The missing pieces can now be "calculated back" with sufficient accuracy.

Current-viewing resistors, however, have the disadvantage that they dissipate power. Also, as power rating of the drive increases, noise spikes across the current-viewing resistor increase, because the inductance to resistance (L/R) ratio increases. A filter is required to remove the noise spikes, and this slows the response and increases fault reaction time. Another disadvantage is that current-viewing resistors do not provide isolated signals. For all these reasons, current viewing resistors become impractical above a certain motor current.

BRIEF DESCRIPTION OF THE INVENTION

In accordance with the invention, novel arrangements are provided for sensing the individual inverter-switch currents using either conventional a-c current transformers or using Rogowski flux sensing coils. The latter solution is particularly attractive because is does not require any magnetic core materials.

Each of the described solutions avoids the use of Hall sensors, is essentially lossless, and provides isolated fast feedback signals. The concepts described marry the operating characteristics of the current-sensing element to those of PWM inverter. By integrating the operating mode of the current-sensing element into that of the inverter, it is possible to deliver isolated current signals that represent the switch currents, at any inverter output frequency, including zero. The inherent low frequency limitations of the basic current-sensing elements themselves, when used as stand-alone components, are circumvented.

Other features and advantages of the present invention will become apparent from the following description of the invention which refers to the accompanying drawings.

BRIEF DESCRIPTION OF THE DRAWINGS

The invention will now be described in greater detail in the following detailed description with reference to the drawings in which:

FIG. 1B shows the possible inverter-switch states for which the output current is known when the inverter input current is sensed as in FIG. 1A.

FIG. 2B shows the possible inverter-switch states for which the output phase current is known.

DETAILED DESCRIPTION OF THE DRAWINGS

Figure 1A:
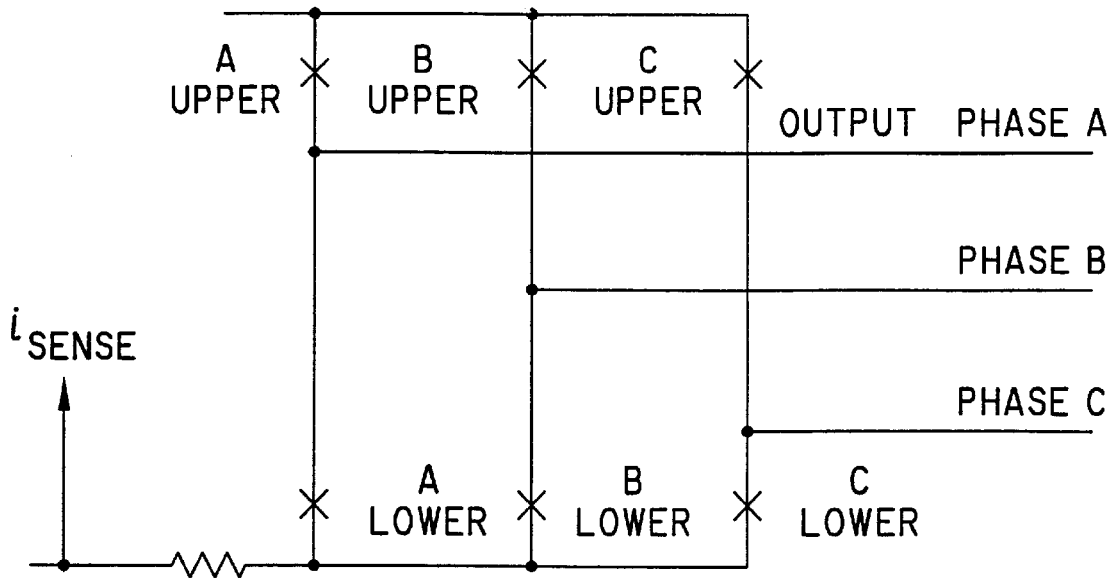
FIG. 1A shows a known arrangement in which the inverter input current is sensed.
Figure 2A:
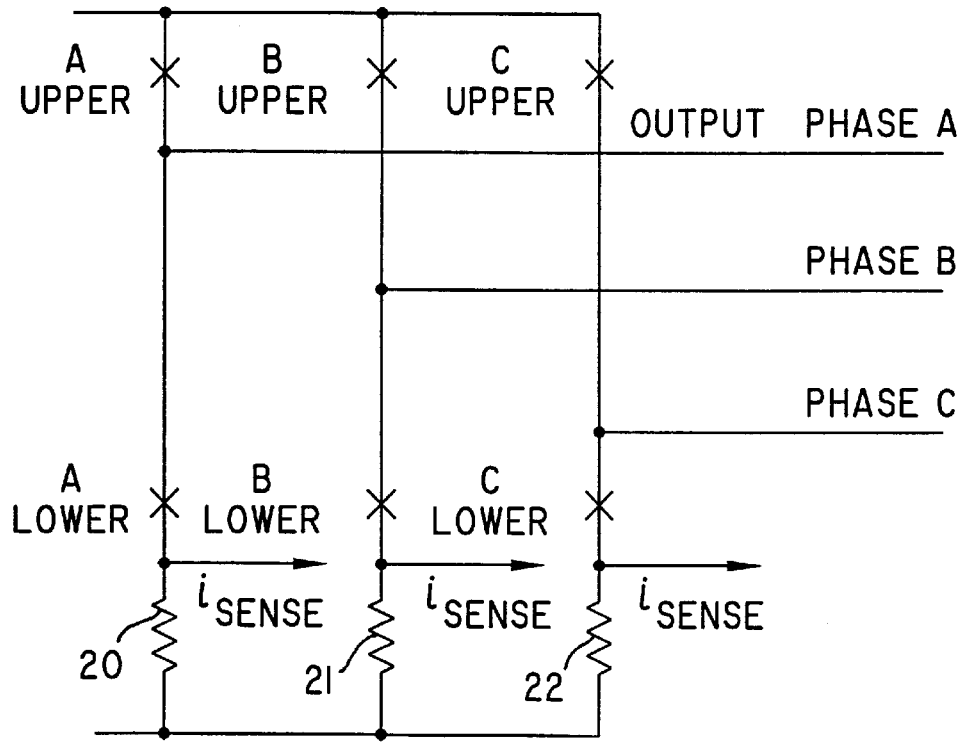
FIG. 2A shows a known arrangement in which the three individual inverter-switch currents are sensed.
Figure 3A:
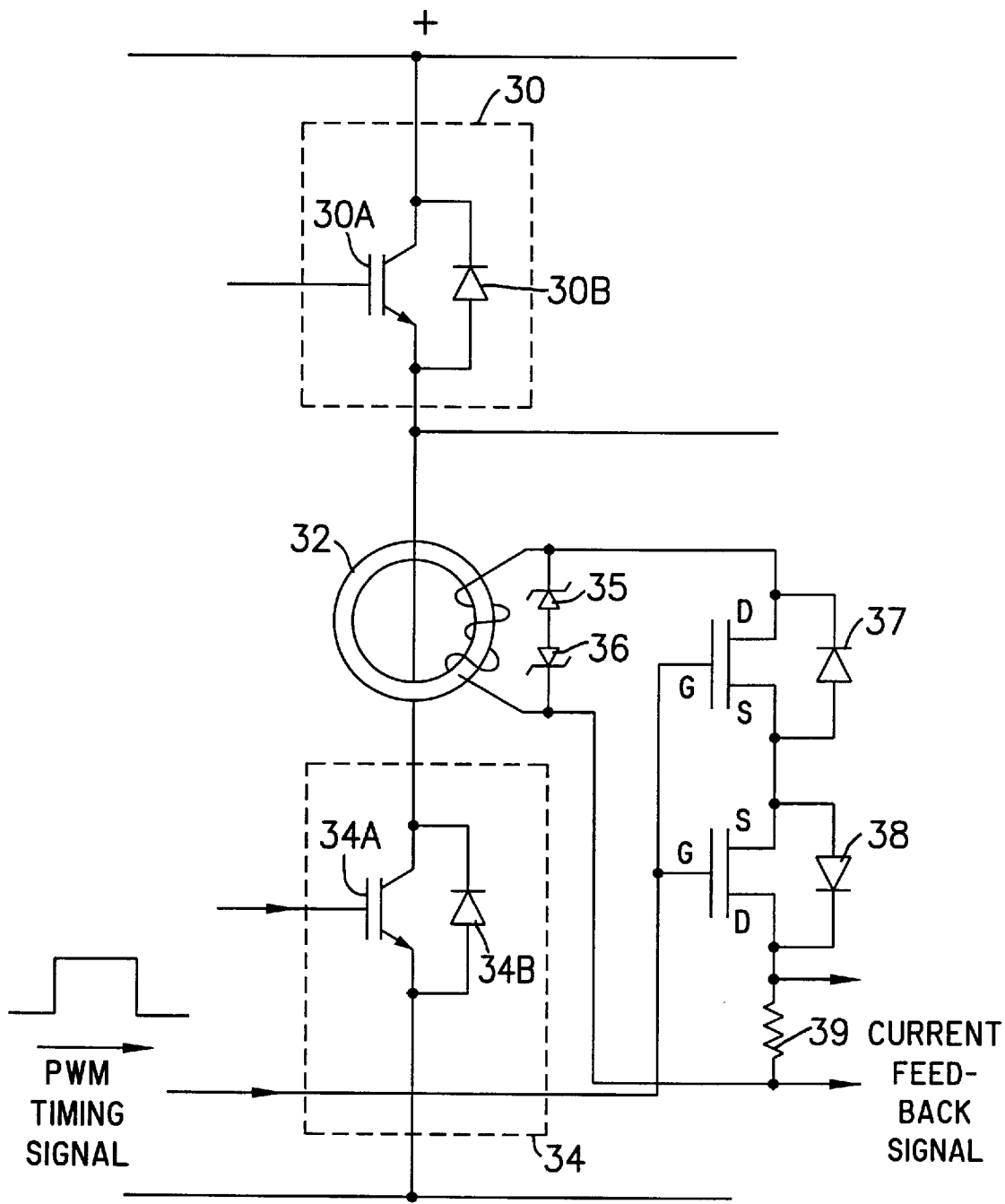
FIG. 3A is a circuit diagram in which an a-c current transformer is used for sensing inverter-switch current according to an embodiment of the invention.

A first preferred embodiment which uses an a-c current transformer for sensing inverter-switch current according to the invention is shown in FIG. 3A. The associated current and voltage waveforms are shown in FIG. 3B.

When the associated IGBT inverter-switch 34 is conducting, the inverter-switch current passes through the primary winding of the transformer 32. The current transformer 32 then operates in its normal manner to deliver an output signal, via its secondary winding, that is proportional to the current in the inverter-switch 34 for either polarity of inverter current, namely either for current through IGBT 34A or diode 34B. Though the transformer 32 is shown connected to the output terminal of the inverter-switch, the transformer will deliver a similar output signal when alternatively connected to the input terminal.

Figure 3B:
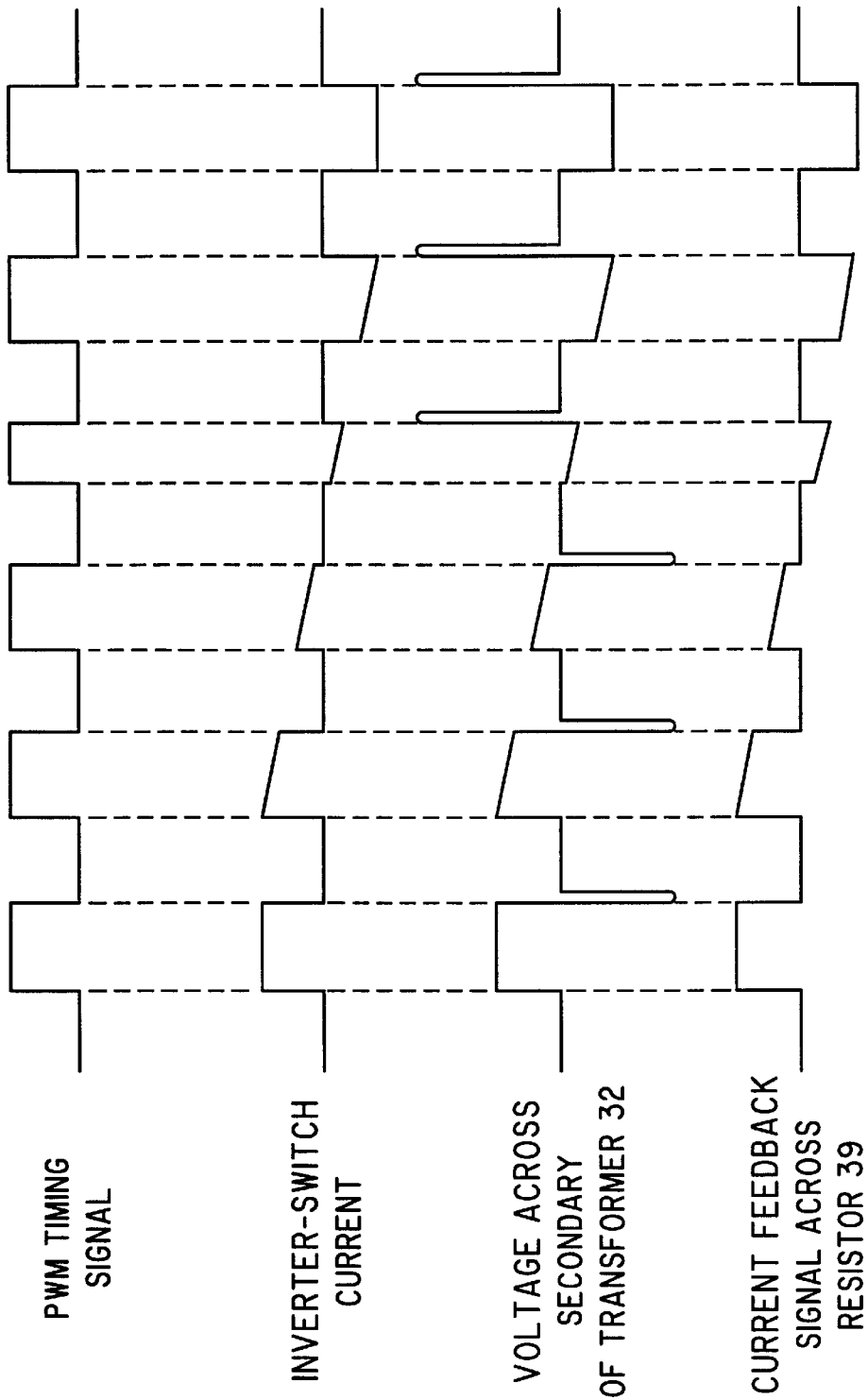
FIG. 3B is a timing diagram for the circuit shown in FIG. 3A.

When the inverter-switch 34 is OFF, the signal-developing resistor 39 is disconnected from the output of the transformer 32 by the a-c switch 37 and 38, which is driven by a pulse width modulation (PWM) timing signal shown in FIG. 3B. The PWM signal also drives the inverter-switch. Disconnecting resistor 39 when the inverter-switch 34 is OFF does not compromise the signal across the resistor because, by definition, there is no inverter-switch current during this interval.

During the OFF interval, magnetizing current in the secondary winding of the transformer is driven to zero by the flyback voltage developed across a pair of clamping zener diodes 35 and 36. The zener diodes preferably have significantly higher breakdown voltage than the normal signal voltage across the resistor 39 to facilitate complete flux resetting during the off-time of the switch, even when the off-time is much shorter than the on-time. If off-time is so short, however, that complete resetting of the flux does not occur, the short reset time is of no practical consequence because a full reset will occur during a subsequent, longer duration OFF period.

With the circuit described above, the current transformer is refreshed and ready, with essentially zero flux, for each new segment of switch current. Thus, a continuing series of unidirectional output signals, which represent the switch current, can be developed across resistor 39, while the flux in the core of the current transformer 32 is kept well below the magnetic saturation value, as shown in FIG. 3B.

Figure 4A:
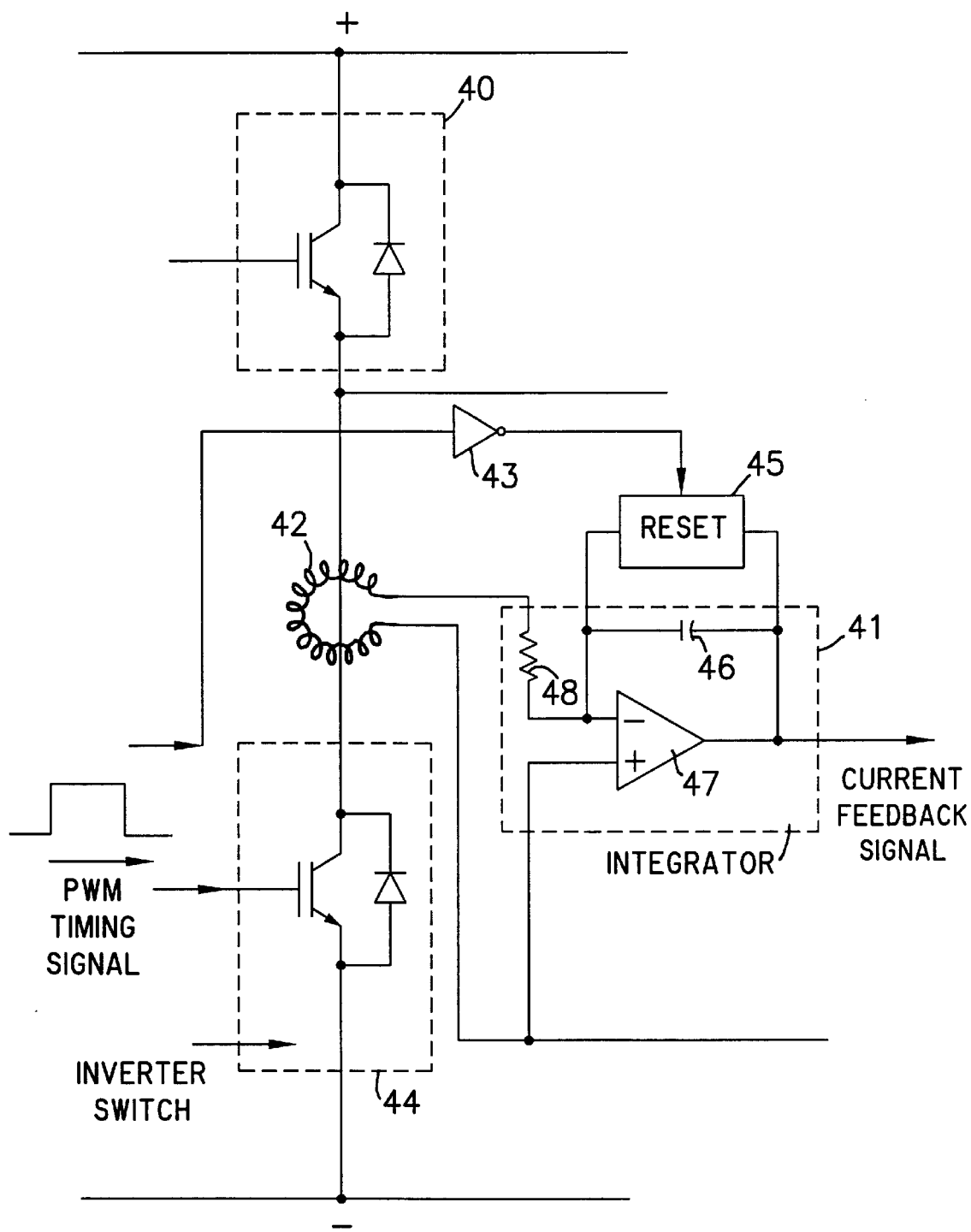
FIG. 4A is a circuit diagram in which a Rogowski coil is used for sensing the inverter-switch current according to another embodiment of the invention.

A second preferred embodiment in which a Rogowski coil is used for sensing the inverter-switch current is shown in FIG. 4A. Here, the Rogowski coil is shown connected to the output terminal of the inverter-switch, but may alternatively be connected to the input terminal. The Rogowski coil 42 is essentially an air cored coil flux sensor and delivers an output voltage that is proportional to the di/dt of the primary current supplied to it by the inverter-switch 44. An integrator 41, which includes an op-amp 47, a resistor 48 and a capacitor 46, is then used to deliver a signal that represents the inverter-switch current.

In principle, if the integrator 41 is ideal and thus has no offset or drift, the integrator would deliver a continuous output signal that is exactly proportional to the inverter-switch current. In practice, however, offset and drift inevitably are present and cause unacceptable errors in the output of the integrator at low output frequency when the integrator is allowed to free-run.

An advantage of the second embodiment is that this problem is overcome by resetting and holding the output of the integrator to zero during the off-time of the associated inverter-switch using reset 45. Since the integrator output should, in any case, be zero during this period, each resetting of the integrator provides a small, but significant, corrective action that pulls the integrator back into calibration and "keeps it honest".

Thus, integrator drift cannot build up, even when the inverter output frequency is zero. The output of the integrator is then a faithful reproduction of the inverter-switch current with no offset.

Advantageously, the arrangement of FIG. 3 is easily implementable and offers a smaller circuit and a cheaper solution than using Hall transducers.

Figure 4B:
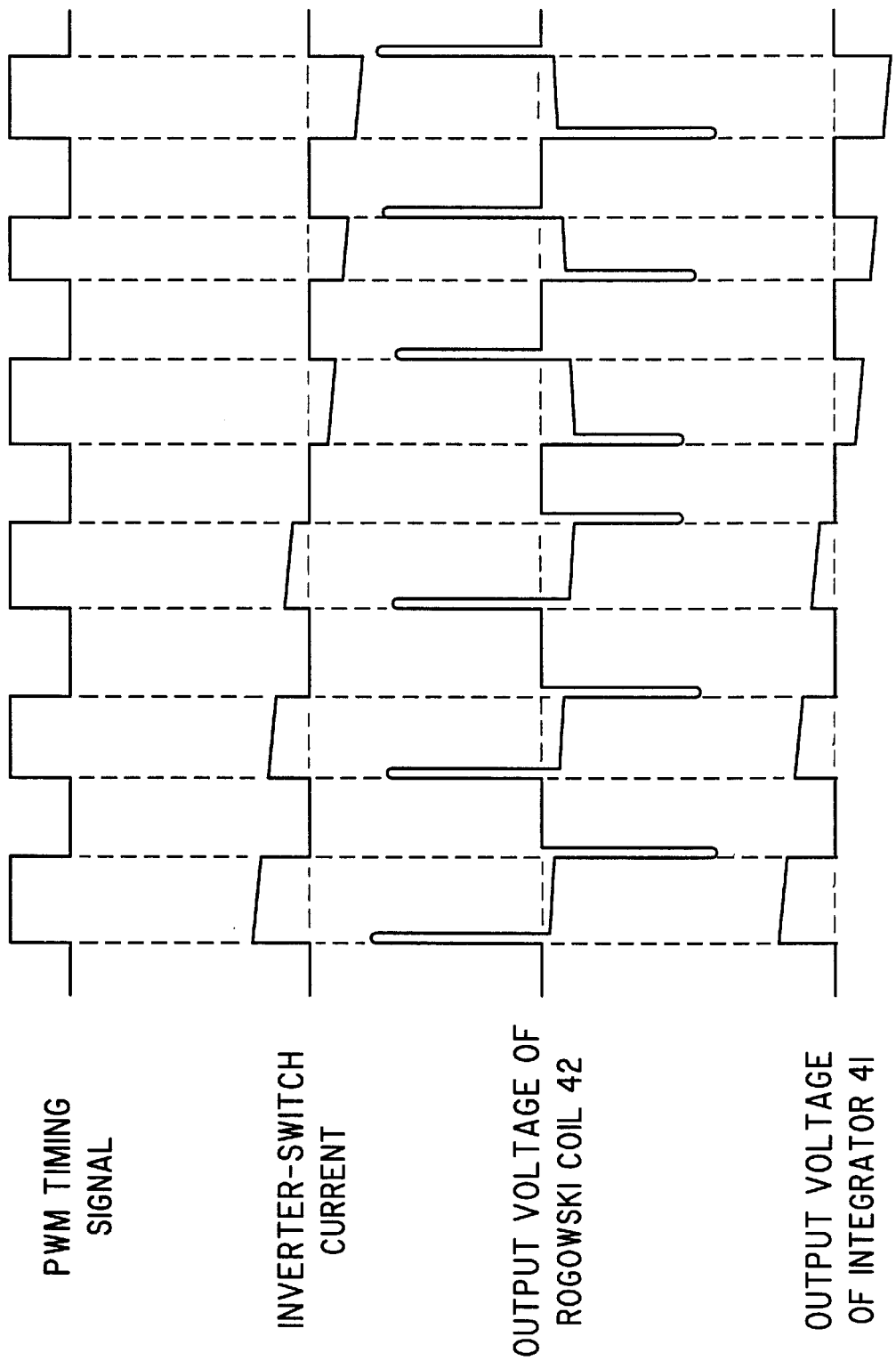
FIG. 4B is a timing diagram for the circuit shown in FIG. 4A.

Moreover, the arrangement of FIG. 4 is also attractive in that no magnetic core is used. The Rogowski coil is also easier and cheaper to manufacture than a current transformer and may be mechanically more compatible with a compact motor controller drive power train assembly.

The Rogowski coil may also be wound on a straight flexible non-magnetic form. The whole coil is then removed and then bent around the primary conductor.

A good quality integrator with fast slew rate is also preferably used.

Figure 5:
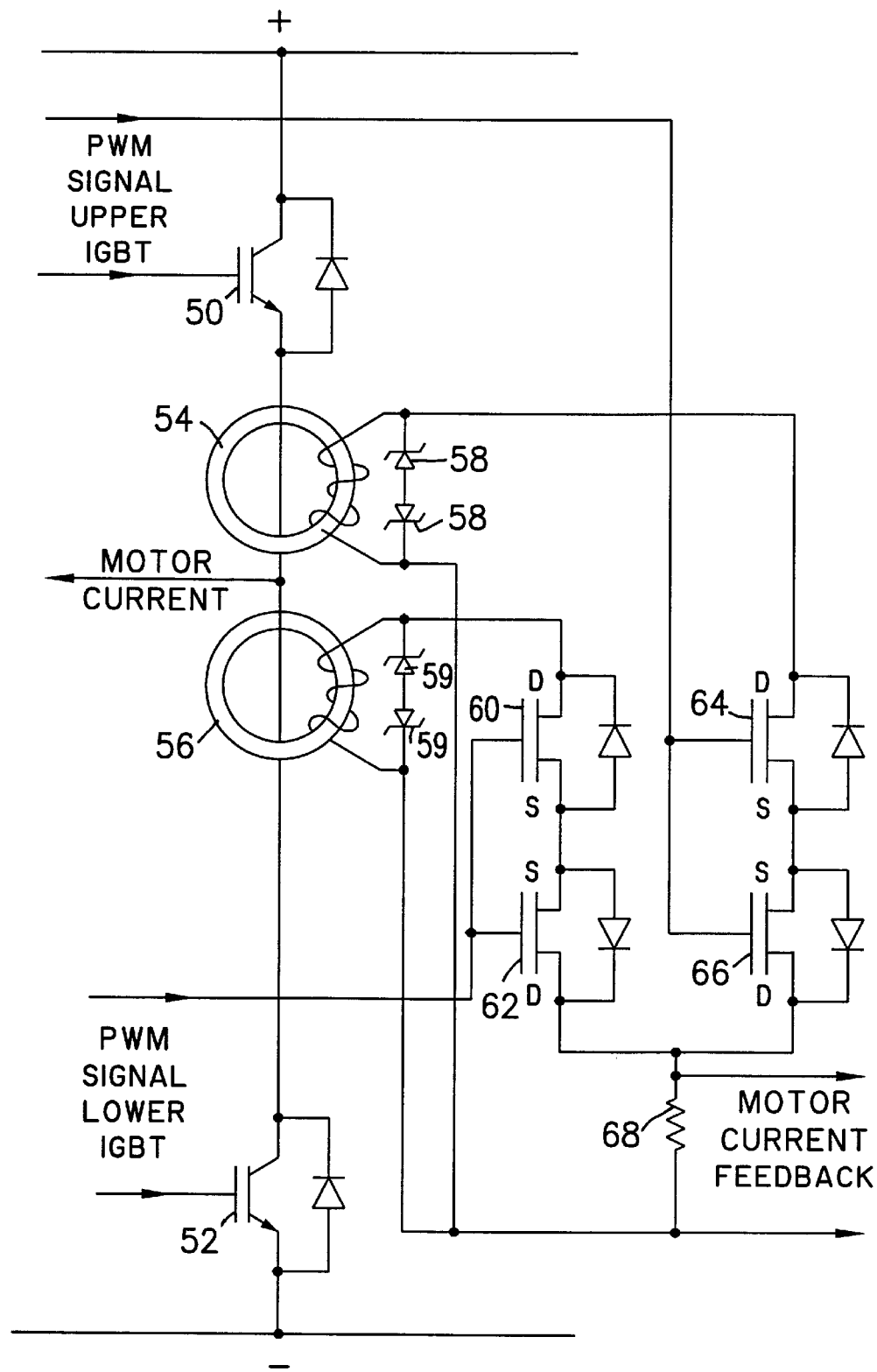
FIG. 5 is a circuit diagram showing the application of the circuit of FIG. 3A for full motor current sensing.
Figure 6:
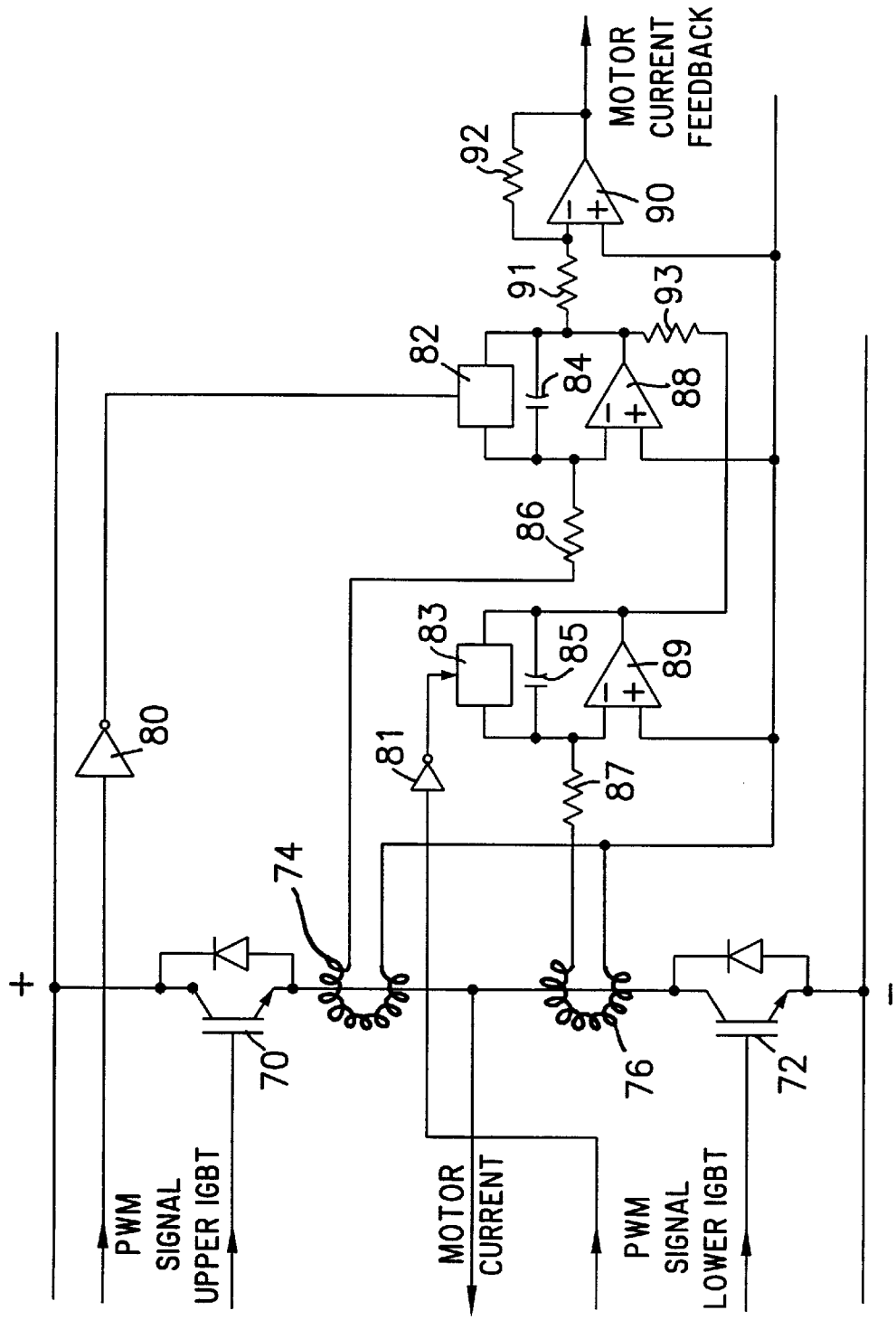
FIG. 6 is a circuit diagram showing an adaptation of the circuit shown in FIG. 4A for full motor current sensing.

FIGS. 5 and 6 show how the embodiments shown in FIGS. 3 and 4, respectively, can be extended to provide full sensing of motor currents. FIG. 5 shows an adaptation using the sensing circuit of FIG. 3 in which the a-c current transformers are used, while FIG. 6 shows an adaptation using the sensing circuit of FIG. 4 in which the Rogowski coils are used.

As FIG. 5 shows, respective sensing circuits are used for each of the upper and lower IGBT inverter-switches 50 and 52 of the bridge leg. When inverter-switch 50 is conducting, current passes through the primary winding of the transformer 54 whose secondary winding delivers an output signal that is proportional to the current in the inverter-switch 50 to signal-developing resistor 68. This signal is disconnected from the resistor 68 by the a-c switch 64 and 66 when the PWM signal that is supplied to the upper IGBT inverter-switch 50 is off.

Similarly, when the lower IGBT inverter-switch 52 is conducting, current passes through the primary winding of transformer 56, and the transformer 56 delivers to resistor 68 an output signal via its secondary winding that is proportional to the current in the associated inverter-switch. The output is disconnected from the resistor 68 by a-c switches 60 and 62 when the PWM signal supplied to the lower inverter-switch 52 is in the off state. The outputs of the two sensing circuits are thus combined to deliver a faithful reproduction of the motor current at the output of that leg.

As noted above, the circuit shown in FIG. 6 uses respective Rogowski coil sensing circuits for each of the upper and lower IGBT inverter-switches 70 and 72 of the bridge leg. Here, a Rogowski coil 74 delivers an output voltage that is proportional to the di/dt of the primary current supplied by upper inverter-switch 70, and Rogowski coil 76 delivers an analogous output voltage for the lower inverter-switch 72. An integrator formed of op-amp 88, capacitor 84 and resistor 86 is used to deliver a signal that represents the upper inverter-switch current, and an integrator formed of op-amp 89, capacitor 85 and resistor 87 deliver a corresponding signal for the lower inverter-switch current. Advantageously, resets 82 and 83 hold the output of the respective integrators to zero during the off-time of the respective PWM signals that are supplied to each of upper and lower inverter-switches 70 and 72. The outputs of the two integrators are then supplied to a summing amplifier circuit formed of op-amp 90, and resistors 91, 92 and 93 to deliver a faithful reproduction of the motor currents at the output of the leg.

According to the invention, the three bridge legs of a 3-phase inverter bridge could use similar sensing circuits as shown in FIG. 5 or FIG. 6. Alternatively, two of the three legs could use these sensing circuits with the current of the third leg being reconstructed as the sum of the other two. The latter arrangement would need a differential transformer, or other means, for sensing ground fault current in the third leg, if the ground fault current value is needed.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A circuit for sensing the current of an inverter-switch, the inverter-switch having an input terminal connected to a respective one of a supply terminal and a common terminal and having an output terminal, the inverter-switch being responsive to a control signal, said circuit comprising:

a current transformer having a primary winding coupled to one of the input and output terminals of said inverter-switch, and having a secondary winding for generating an output signal that is proportional to the current in the inverter-switch;

a resistor coupled to a terminal of said secondary winding of said transformer; and an a-c switch coupled in series between another terminal of said secondary winding and said resistor and being responsive to said control signal for disconnecting said resistor when said inverter-switch is in an off state.

2. The circuit of claim 1, further comprising a clamping circuit for driving the flux and voltage across said secondary winding substantially to zero when said inverter circuit is in the off state.

3. The circuit of claim 2, wherein said clamping circuit includes a pair of oppositely poled, series connected zener diodes.

4. The circuit of claim 1, wherein said a-c switch comprises a pair of MOS-gate controlled semiconductor devices.

5. The circuit of claim 1, wherein said control signal is a PWM timing signal.

6. A circuit for sensing the current of an inverter-switch, the inverter-switch having an input terminal connected to a respective one of a supply terminal and a common terminal and having an output terminal, the inverter-switch being responsive to a control signal, said circuit comprising:

a flux sensor having a primary terminal coupled to one of said input and output terminals of said inverter-switch and having a secondary terminal for delivering an output voltage that is proportional to the di/dt of the output current of said inverter-switch;

an integrator coupled to said secondary winding for generating a signal proportional to the inverter-switch current; and a reset circuit for resetting and holding the output of said integrator to zero when said control signal turns off said inverter-switch.

7. The circuit of claim 6, wherein said flux sensor is a Rogowski coil.

8. The circuit of claim 6, wherein said integrator includes an op-amp.

9. The circuit of claim 6, wherein said control signal is a PWM timing signal.

10. An inverter circuit comprising:

an inverter-switch responsive to a control signal and having an input terminal coupled to a respective one of said supply terminal and said common terminal, and having an output terminal;

a current transformer having a primary winding coupled to one of said input and output terminals of said inverter-switch, and having a secondary winding for generating an output signal that is proportional to the current in said inverter-switch;

a resistor coupled to a terminal of said secondary winding of said transformer; and an a-c switch coupled in series between another terminal of said secondary winding and said resistor and being responsive to said control signal for disconnecting said resistor when said inverter-switch is in an off state.

11. The circuit of claim 10, wherein said inverter-switch is an MOS-gate controlled semiconductor device.

12. The circuit of claim 10, wherein said inverter-switch is an IGBT.

13. An inverter circuit comprising:

an inverter-switch responsive to a control signal and having an input terminal coupled to a respective one of said supply terminal and said common terminal, and having an output terminal;

a flux sensor having a primary terminal coupled to one of said input and output terminals of said inverter-switch and having a secondary terminal for delivering an output voltage that is proportional to the di/dt of the output current of said inverter-switch;

an integrator coupled to said secondary winding for generating a signal proportional to the inverter-switch current; and a reset circuit for resetting and holding the output of said integrator to zero when said control signal turns off said inverter-switch.

14. The circuit of claim 13, wherein said inverter-switch comprises an MOS-gate controlled semiconductor device.

15. The circuit of claim 13, wherein said inverter-switch comprises an IGBT.

16. A circuit for sensing the output current in a leg of an inverter bridge formed of first and second inverter-switches, said first inverter-switch responsive to a first control signal and having an input terminal coupled to a respective one of a supply terminal and a common terminal and having an output terminal, said second inverter-switch being responsive to a second control signal and having an input terminal coupled to another of said supply terminal and said common terminal and having an output terminal, said sensing circuit comprising:

a first current transformer having a primary winding coupled to one of said input and output terminals of said first inverter-switch, and having a secondary winding for generating a first output signal that is proportional to the current in said first inverter-switch;

a resistor coupled to a terminal of said secondary winding of said transformer;

a first a-c switch coupled in series between another terminal of said secondary winding of said first transformer and said resistor and being responsive to said first control signal for disconnecting said resistor from said first transformer when said first inverter-switch is in an off state;

a second current transformer having a primary winding coupled to one of said input and output terminals of said second inverter-switch, and having a secondary winding for generating a second output signal that is proportional to the current in said second inverter-switch;

said resistor being further coupled to a terminal of said secondary winding of said second transformer; and a second a-c switch coupled in series between another terminal of said secondary winding of said second transformer and said resistor and being responsive to said second control signal for disconnecting said resistor from said second transformer when said second inverter-switch is in an off state.

17. A circuit for sensing the output current in a leg of an inverter bridge formed of first and second inverter-switches, said first inverter-switch responsive to a first control signal and having an input terminal coupled to a respective one of a supply terminal and a common terminal and having an output terminal, said second inverter-switch being responsive to a second control signal and having an input terminal coupled to another of said supply terminal and said common terminal and having an output terminal, said sensing circuit comprising:

a first flux sensor having a primary terminal coupled to one of said input and output terminals of said first inverter-switch and having a secondary terminal for delivering a first output voltage that is proportional to the di/dt of the output current of said first inverter-switch;

a first integrator coupled to said secondary winding of said first flux sensor for generating a signal proportional to the first inverter-switch current; and a first reset circuit for resetting and holding the output of said first integrator to zero when said first control signal turns off said first inverter-switch;

a second flux sensor having a primary terminal coupled to one of said input and output terminals of said second inverter-switch and having a secondary terminal for delivering a second output voltage that is proportional to the di/dt of the output current of said second inverter-switch;

a second integrator coupled to said secondary winding of said second flux sensor for generating a signal proportional to the second inverter-switch current;

a second reset circuit for resetting and holding the output of said second integrator to zero when said second control signal turns off said second inverter-switch; and a combining circuit for combining the outputs of said first and second integrators.

\* \* \* \* \*